United States Patent [19]
Dean

[11] Patent Number: 5,738,226
[45] Date of Patent: Apr. 14, 1998

[54] GUIDE PIECE AND METHOD FOR MOUNTING TO A CHASSIS IN MULTIPLE ORIENTATIONS

[75] Inventor: Ronald P. Dean, Ft. Collins, Colo.

[73] Assignee: Hewlett-Packard Company, Palo Alto, Calif.

[21] Appl. No.: 741,499

[22] Filed: Oct. 31, 1996

[51] Int. Cl.⁶ .................... A47G 19/08; H05K 7/14
[52] U.S. Cl. .................... 211/41.17; 361/756; 361/802; 439/64
[58] Field of Search ................ 211/41.17; 361/756, 361/752, 796, 801, 802; 439/59, 64, 325, 345, 377

[56] References Cited

U.S. PATENT DOCUMENTS

| | | | |
|---|---|---|---|
| 3,838,777 | 10/1974 | Thornicroft et al. | 211/41.17 |
| 3,878,438 | 4/1975 | Weisman | 361/802 |
| 3,950,057 | 4/1976 | Calabro | 211/41.17 X |
| 4,022,326 | 5/1977 | Marconi | 211/41.17 |
| 4,068,290 | 1/1978 | Wetherbee | 361/802 |
| 4,327,835 | 5/1982 | Leger | 361/756 X |
| 5,016,142 | 5/1991 | White | 211/41.17 X |
| 5,191,514 | 3/1993 | Kabat et al. | 211/41.17 X |
| 5,533,631 | 7/1996 | Marchetti | 211/41.17 |

OTHER PUBLICATIONS

Bivar Catalog, Unique Problem Solvers for Printed Circuit Board Component Assembly & Packaging, Bivar, Inc., 4 Thomas, Irvine, CA 92718, Copyright 1992.

Schroff Catalog, Electronic Enclosures Microprocessor Packaging Systems, Schroff, Inc., 170 Commerce Drive, Warwick, R.I. 02886. (Jul. 1989).

*Primary Examiner*—Jose V. Chen
*Assistant Examiner*—James O. Hansen

[57] ABSTRACT

A guide piece molded out of a rigid but slightly resilient material, such as plastic, having an elongated body with a U-shaped channel, used to hold an edge of a printed circuit card, extending the length of the guide piece to form an opening on each end. The guide piece has a plurality of raised tabs along the external surface of one leg of the channel and middle and end hubs on the external surface of the other leg of the channel. The raised tabs mate with fingers formed in a chassis, and the middle and end hubs mate with holes in the chassis. The combination of the raised tabs mating with fingers, and the middle and end hubs mating with the holes, secures the guide piece to the chassis, without requiring protrusions through the chassis.

11 Claims, 10 Drawing Sheets

GUIDE PIECE AND METHOD FOR MOUNTING TO A CHASSIS IN MULTIPLE ORIENTATIONS

FIELD OF THE INVENTION

This invention relates to electronic hardware equipment contained in a chassis and more particularly to securing electronic components to the interior of a chassis. Even more particularly, the invention relates to a plastic guide piece and method of mounting the guide piece to the interior of a chassis for receiving electronic circuit cards.

BACKGROUND OF THE INVENTION

Industrial electronic hardware equipment has typically been designed to allow easy access to the electronic components contained inside the chassis for testing, repair, and replacement purposes. It is desirable that individual electronic circuit cards be easily installed and removed. Securing electronic circuit cards inside the chassis and allowing easy installation and removal is accomplished by attaching plastic guides to the interior of the chassis. The plastic guides are typically used in pairs and are affixed to opposite sides of a chassis facing each other. The plastic guides are grooved so that opposite edges of an electronic circuit card may be inserted into the groves and become seated securely between the opposing pairs of plastic guides. The plastic guides may be attached to a chassis with the grooves oriented horizontally or vertically. A single plastic guide may also be used to secure one edge of an electronic circuit card. The other edge may be secured in some other fashion. For example, a single plastic guide may be used in conjunction with an expansion slot bracket found in many personal computers which is screwed into the back of the frame of the chassis. Additionally, plastic guides may be used to hold a metal plate or tray which in turn holds an electronic circuit card.

Plastic guides have been made in various sizes and shapes depending upon chassis location and orientation required to receive an edge of an electronic circuit card. Various approaches have been utilized in attaching plastic guides to a chassis. One approach utilizes a rivet-on plastic guide. This requires a rivet part and access to the exterior surfaces of the chassis for installation purposes. The rivets protrude from the exterior surfaces of the chassis and thus require clearances around the exterior of the chassis. These rivet protrusions can be scraped, bumped, or caught on objects brought near the vicinity of the exterior of the chassis. This may cause the rivets to break and the plastic guide to become unsecured from the chassis. Additionally, the stress in the rivets over time may cause cracking of the plastic resulting in breakage, thus causing the plastic guide to become unsecured from the chassis. Replacing a rivet-on plastic guide that has failed is difficult due to the chassis being full of electronic components and the access to the exterior surfaces of the chassis required to use the rivet tool. Also, if a rivet-on plastic guide needs to be removed for some reason, the rivet connection must be severed or broken. Once removed, the plastic guide is not reusable.

Another approach uses a snap-on plastic guide. Typically the plastic guide has one or more protrusions on its surface that are forced through openings in the chassis. These protrusions are designed so that they either expand after insertion or have an initial larger diameter portion than the opening they have been forced through, thus securing the plastic guide piece to the chassis. This functional approach, however, makes it difficult to remove the plastic guide once it has been snapped into place. Once removed, the plastic guide may be so damaged that it may not be reusable and another plastic guide must be used in its place. Additionally, the protrusions through the surface require clearances on the outside surfaces of the chassis, making them susceptible to the same breakage problems associated with rivet-on plastic guides.

An additional approach utilizes a plastic guide piece with a "T" shaped protrusion that engages a keyhole type slot in the chassis. The top of the "T" inserts in the slot. The guide is then moved laterally engaging one arm of the "T" over the outer surface of the chassis, preventing the plastic guide from moving perpendicular to the chassis surface. In some instances the plastic guide may also have a bump or other protrusion that engages or snaps into a hole or some other detail to prevent movement of the plastic guide in a direction parallel to the chassis surface.

In some instances, rivet-on, snap-on, or keyhole type plastic guides are not practical because of the shape of the chassis and required orientation of the plastic guides, such as in a corner offset. In such cases, protrusions through the surface of the chassis may be highly undesirable or not even feasible.

It is thus apparent that there is a need in the art for an improved apparatus and/or method which solves the problems of the current art. There is a need in the art for one universal guide piece that may be secured to the interior of a chassis in multiple orientations so that electronic circuit cards may be inserted horizontally or vertically. There is also a need in the art for a plastic guide that does not require access to the exterior surfaces of the chassis for installation, that does not require the use of rivets or other protrusions through the surface of the chassis, and does not require clearance on the outer surface for attachment devices. There is further need in the art for a plastic guide that is easily installed and removed, that is not damaged in the removal process so that the plastic guide can be used over and over again, and that does not require the use of any special tools for installation or removal. There is a still further need in the art for a plastic guide that is not susceptible to breakage either from bumping or scraping of exterior protruding attachment devices or stress in the attachment device itself and that can be located in an interior corner offset without protrusions. The present invention meets these and other needs in the art.

SUMMARY OF THE INVENTION

It is an aspect of the present invention to attach a guide piece used for receiving electronic circuit cards internally to a chassis in multiple orientations.

It is another aspect of the invention that the guide piece be universal such that the same guide piece can attach to the chassis in multiple orientations.

It is yet another aspect of the invention that the guide piece may be installed and removed without the use of tools. It is still yet another aspect of the invention that the same guide piece may be used a multiple of times, being installed and removed over and over again.

A further aspect of the invention is a guide piece that does not require protrusions through the chassis for attachment purposes.

A still further aspect of the invention is a guide piece that does not require the use of snaps, rivets, or other attachment devices. A further aspect of the invention is a guide piece that does not require clearance on any external chassis surface for attachment or removal purposes.

Another aspect of the invention is a guide piece that does not require access to any external surfaces of the chassis for installation or removal.

A still further aspect of the invention is a guide piece may be easily mounted into a corner or offset corner of a chassis.

The above and other aspects of the invention are accomplished with a guide piece molded out of a rigid but slightly resilient material, such as plastic. The guide piece has an elongated body with a U-shaped channel extending down the entire length of the guide piece, wherein the U-shaped channel forms an opening on each end of the guide piece. This U-shaped channel is used to hold an edge of an electronic circuit card. At least one such guide piece is attached internally to a chassis so that an edge of an electronic circuit card may be received into the U-shaped channel of the guide piece, thus helping to secure the electronic circuit card in its proper place inside the chassis. The guide piece thus allows for easy installation and removal of electronic circuit cards for repair, testing, or replacement purposes.

The guide piece has a plurality of raised tabs along the external surface of one leg of the U-shaped channel and a plurality of middle and end nubs on the external surface of the other leg of the U shaped channel.

The raised tabs are designed to mate with fingers that have been formed into the chassis. The middle and end nubs are designed to mate with cut outs in the chassis. The combination of the raised tabs mating with fingers and the middle and end nubs mating with cut outs secures the guide piece to the chassis.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
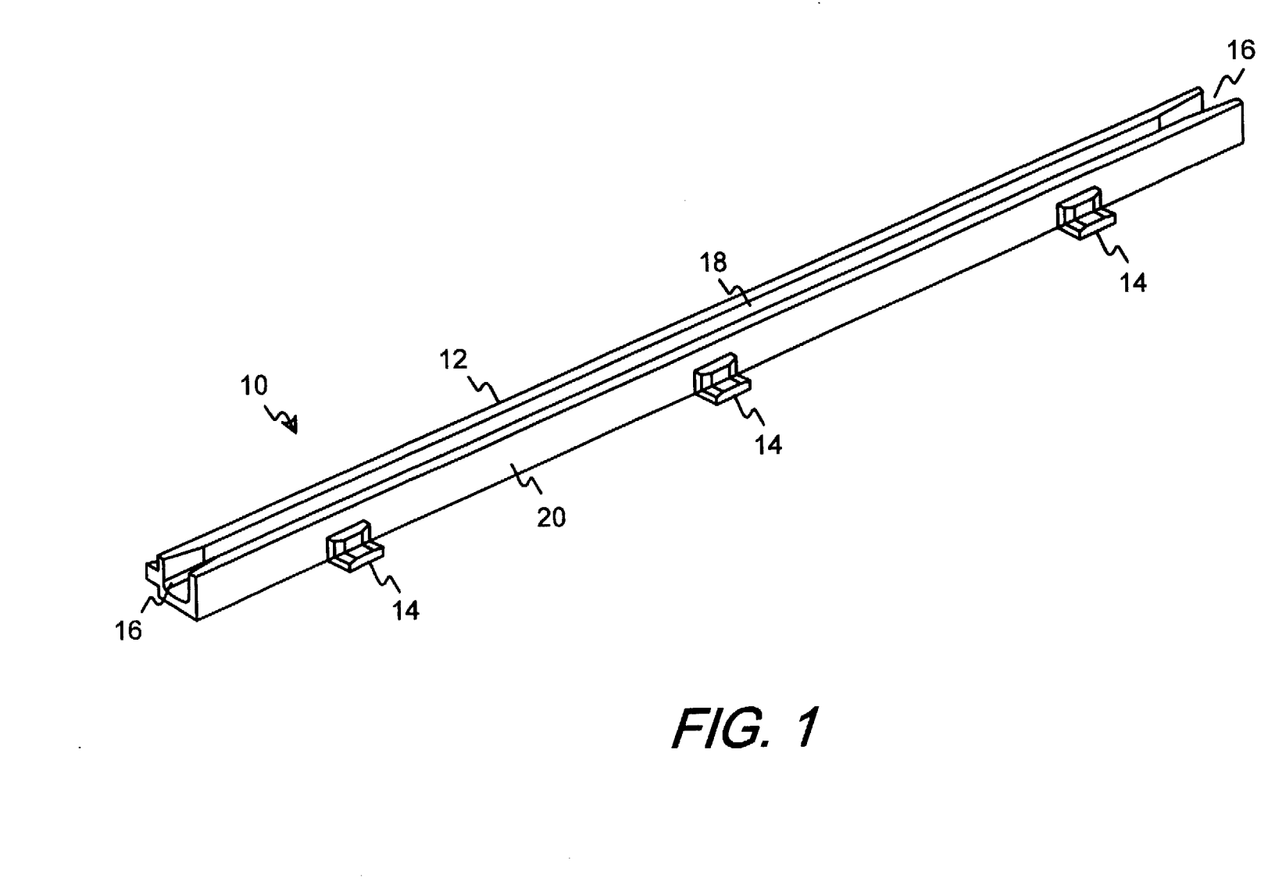
FIG. 1 shows a perspective view of one side of the guide piece.

FIG. 1 shows a perspective view of a guide piece of the present invention. Referring now to FIG. 1, guide piece 10 is comprised of an elongated body 12 with a U-shaped channel 18 extending down the entire length of elongated body 12 forming end openings 16 on either end. In the preferred embodiment the end openings 16 are beveled at an approximate angle of 9.46° to allow for easier insertion of an edge of an electronic circuit card.

An outer surface 20 extends down the length of one leg of U-shaped channel 18. A plurality of raised tabs 14 are located along and molded into outer surface 20. One skilled in the art will recognize that in addition to being molded into the guide piece, the raised tabs 14 could also be attached or affixed to external surface 20 of elongated body 12 with glue or adhesive. Raised tabs 14 are L-shaped with one leg of the L oriented parallel to outer surface 20 and extending towards U-shaped channel 18 and the other leg of the L extending substantially perpendicular to outer surface 20. In the preferred embodiment, each leg of raised tabs 14 has a flat surface whose side edges are beveled downward at an angle from the flat surface (as more fully shown in FIG. 10), to allow for easier mating when attaching guide piece 10 to a chassis (not shown in FIG. 1). The one leg of the L oriented parallel to outer surface 20 has side edges beveled downward at an approximate angle of 18.43°. The other leg of the L extending substantially perpendicular to outer surface 20 has side edges beveled downward at an approximate angle of 25.0°.

Figure 2:
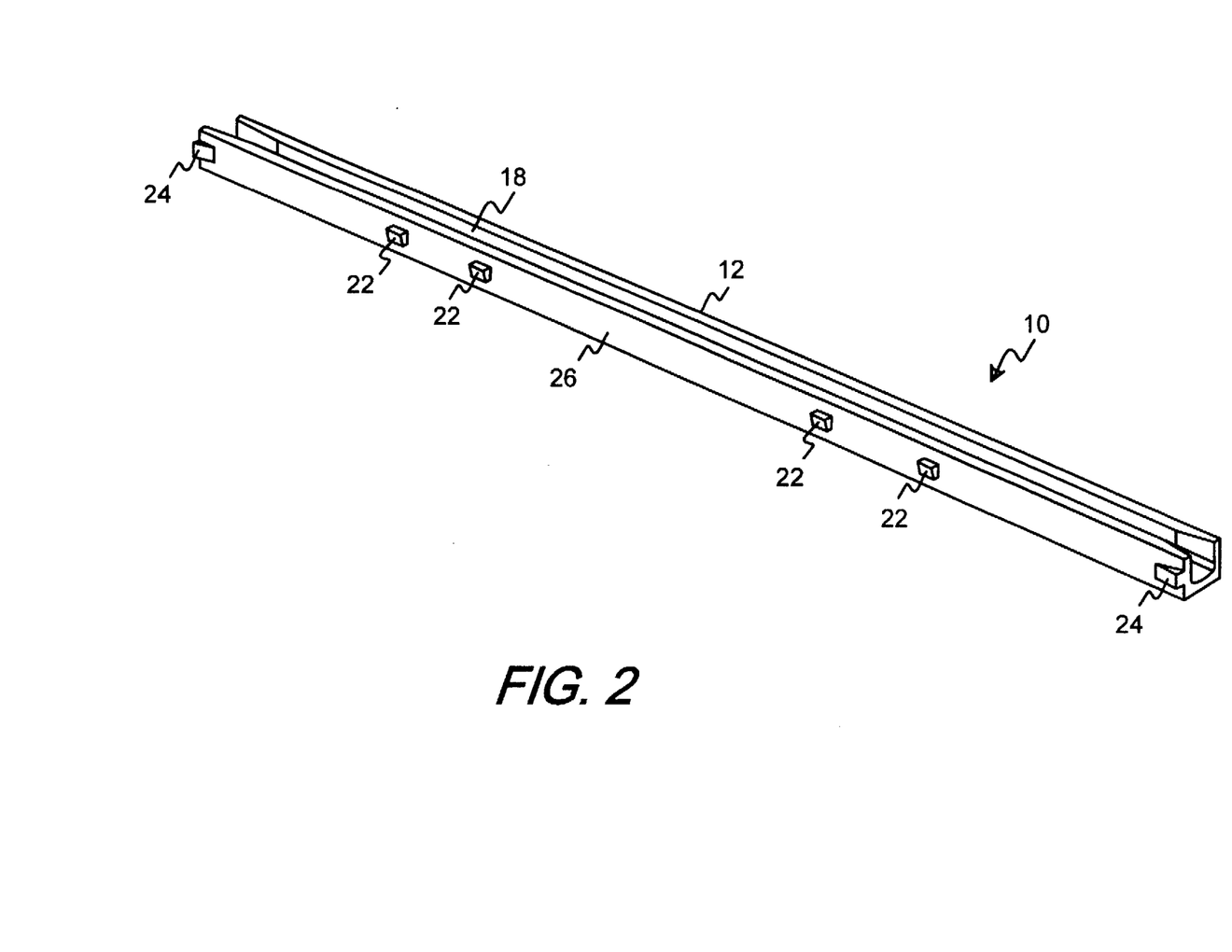
FIG. 2 shows a second perspective view of the other side of the guide piece.

FIG. 2 shows another perspective view of guide piece 10. Referring now to FIG. 2, an outer surface 26 extends down the length of the other leg of U-shaped Channel 18. A plurality of middle hubs 22 are located between the ends of outer surface 26. In the preferred embodiment, the middle nubs 22 are beveled at an approximate angle of 16.36° in the direction towards U-shaped channel 18 (as more fully shown in FIG. 12) to aid installation. Also located on outer surface 26 at each end are end nubs 24. In the preferred embodiment, the end nubs 24 are beveled at an approximate angle of 18.45° in the direction towards the end of the guide piece 10 (as more fully shown in FIG. 11) to aid in removal of the guide piece. One skilled in the art will recognize that in addition to being molded into the form, middle hubs 22 and end nubs 24 could also be attached or affixed to external surface 26 of elongated body 12 with glue or adhesive.

Figure 3:
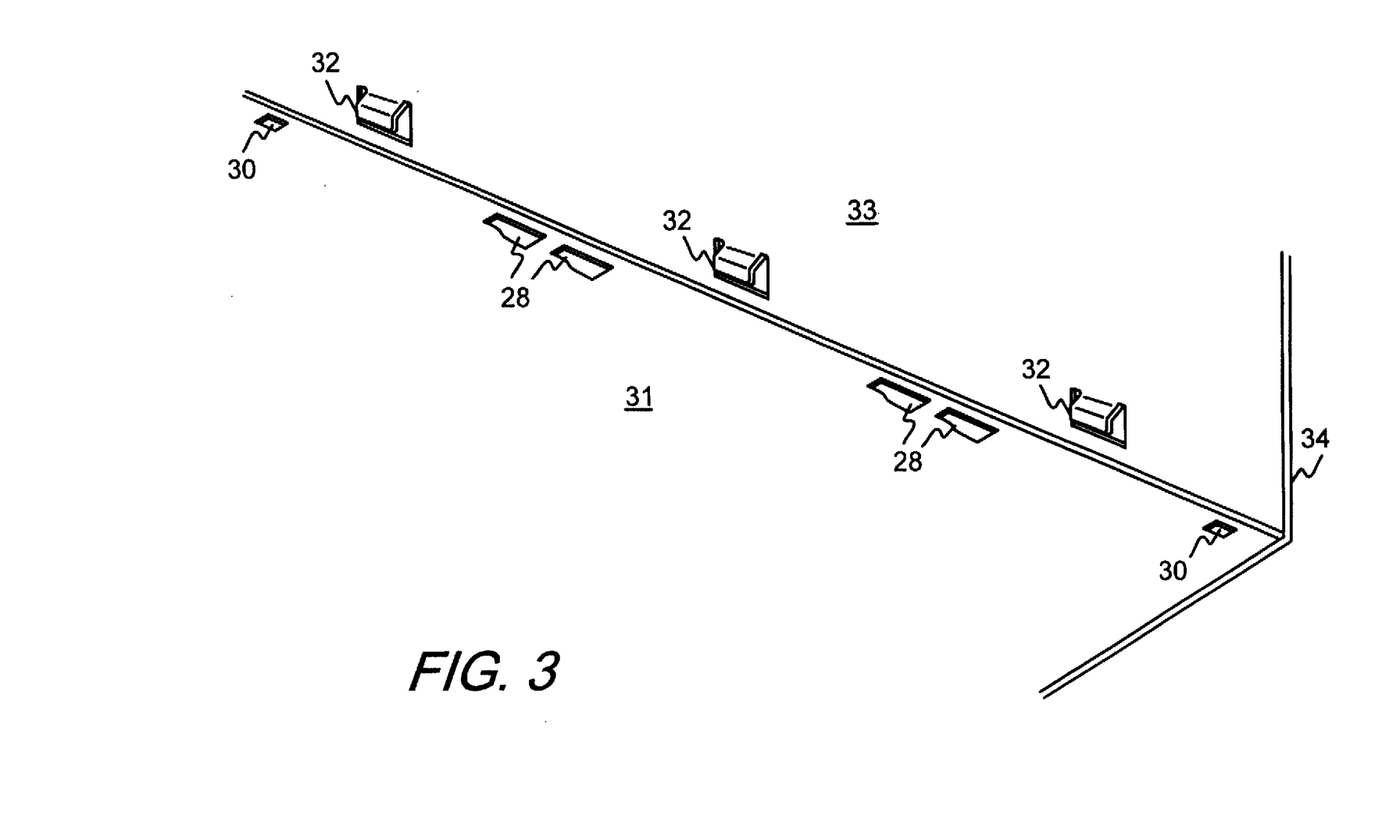
FIG. 3 shows a perspective view of a typical corner of a chassis with fingers and middle nub holes and end hub holes.

FIG. 3 shows a perspective view of the inside corner of a typical chassis 34. Referring now to FIG. 3, end nub holes 30 are cut out from bottom 31 of chassis 34 for receiving end nubs 24. Middle nub holes 28 are cut out from bottom 31 of chassis 34 for receiving middle nubs 22. Middle hub holes 28 may also be sized only slightly larger than middle nubs 22. Fingers 32 are formed in adjacent side 33 of chassis 34 for mating with raised tabs 14.

Figure 4:
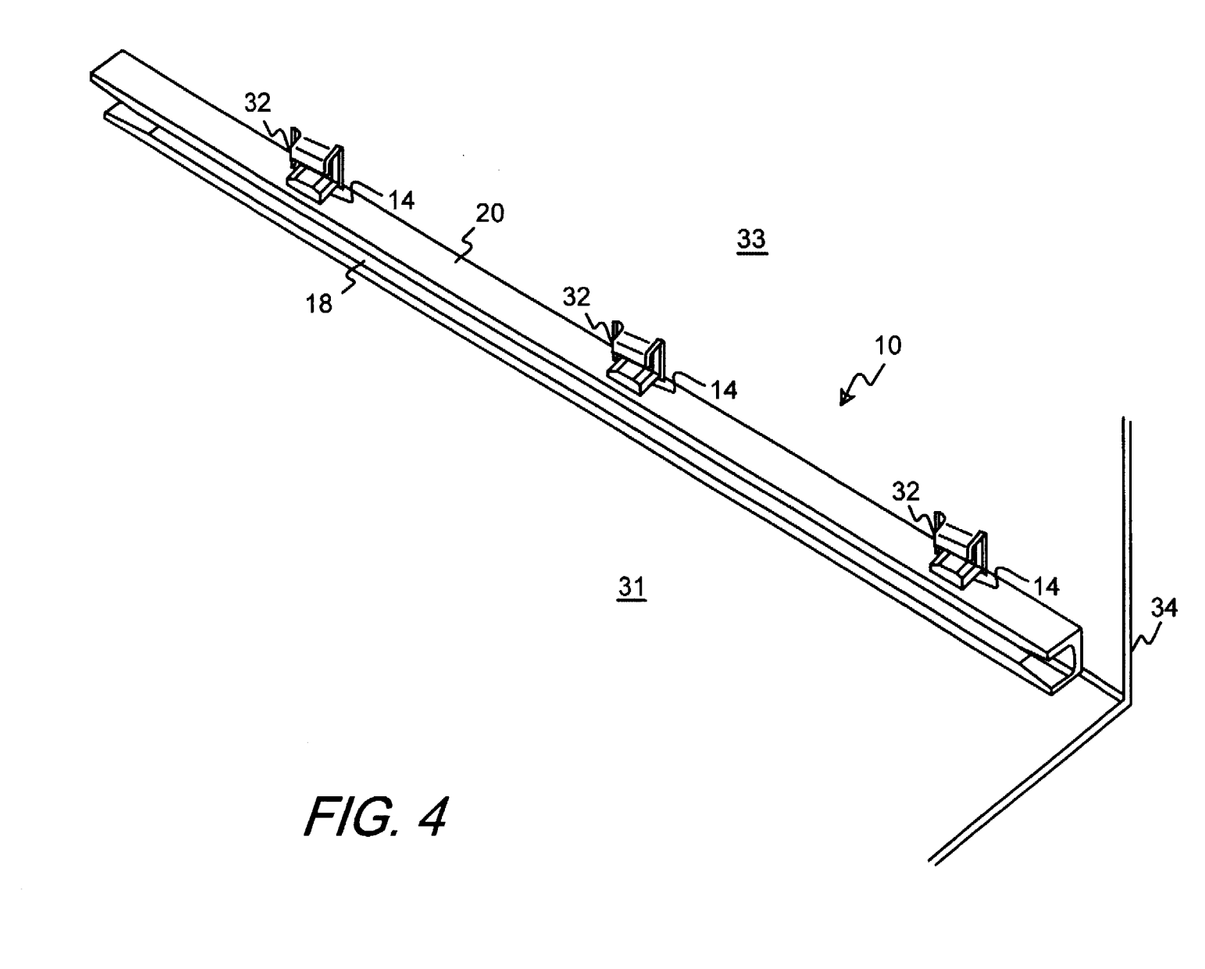
FIG. 4 shows a perspective view of a guide piece that has been corner mounted on the chassis shown in FIG. 3.

Referring now to FIG. 4, guide piece 10 is shown attached to chassis 34 shown in FIG. 3. Attaching guide piece 10 in this orientation, wherein U-shaped channel 18 faces horizontally with respect to bottom 31 of chassis 34, comprises positioning guide piece 10 so that outer surface 26 faces down, outer surface 20 faces up, and U-shaped channel 18 faces horizontally away from adjacent side 33 of chassis 34. Guide piece 10 is placed flush with adjacent side 33 and bottom 31 of chassis 34 with raised tabs 14 on one side of fingers 32. Another way to describe this is to position guide piece 10 such that raised tabs 14 are beside and offset to fingers 32. Guide piece 10 is then moved laterally to orient raised tabs 14 under and behind fingers 32.

Figure 5:
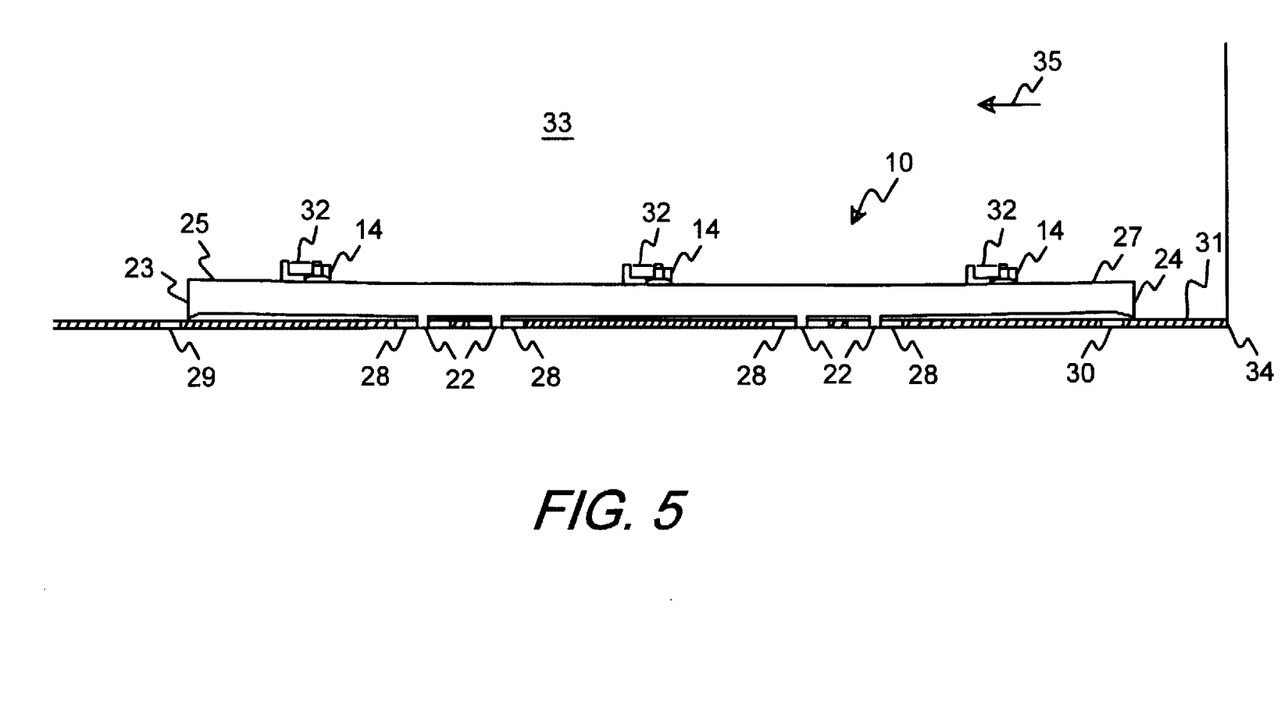
FIG. 5 shows a cross section in plan view of a guide piece as it is being attached in the orientation shown in FIG. 4.

FIG. 5 shows a cross section of guide piece 10 being attached to chassis 34 in the horizontal orientation shown in FIG. 4. Guide piece 10 is positioned flush against adjacent side 33 and bottom 31 of chassis 34 and moved laterally in the direction indicated by directional arrow 35. One skilled in the art will recognize that for installation guide piece 10 may also be positioned with raised tabs 14 on the opposite side of Fingers 32 as shown in FIG. 5 and moved in a lateral direction opposite to that indicted by directional arrow 35.

As raised tabs 14 begin contact along their beveled edges with Fingers 32, the middle portion of guide piece 10 is forced down, flexing guide piece 10 into a mild bow shape, and middle hubs 22 begin to seat in middle hub holes 28. End hubs 23 and 24 are still resting on the upper surface of bottom 31 of chassis 34. As guide piece 10 is further moved laterally in the direction indicated by directional arrow 35, end hubs 23 and 24 seat into end hub holes 29 and 30, snapping down into place due to the tension in the flexed guide piece 10. Snapping into place relieves the flexed bow shape of guide piece 10 and raised tabs 14 become fully mated with Fingers 32, and middle nubs 22 and end nubs 23 and 24 fully seat with middle nub holes 28 and end hub holes 29 and 30 respectively.

To remove guide piece 10 from chassis 34 from the horizontal orientation shown in FIG. 4 and FIG. 5, front end 27 of guide piece 10 is lifted vertically to allow end nub 24 to clear end nub hole 30. After being lifted, guide piece 10 is moved laterally in the opposite direction indicated by directional arrow 35 of FIG. 5. As guide piece 10 is lifted and moved, trailing end 25 of guide piece 10 slides along the beveled surface of end nub 23 up and out of end nub hole 29. When raised tabs 14 pass completely from behind and under fingers 32, guide piece 10 may then be fully removed from chassis 34.

Figure 6:
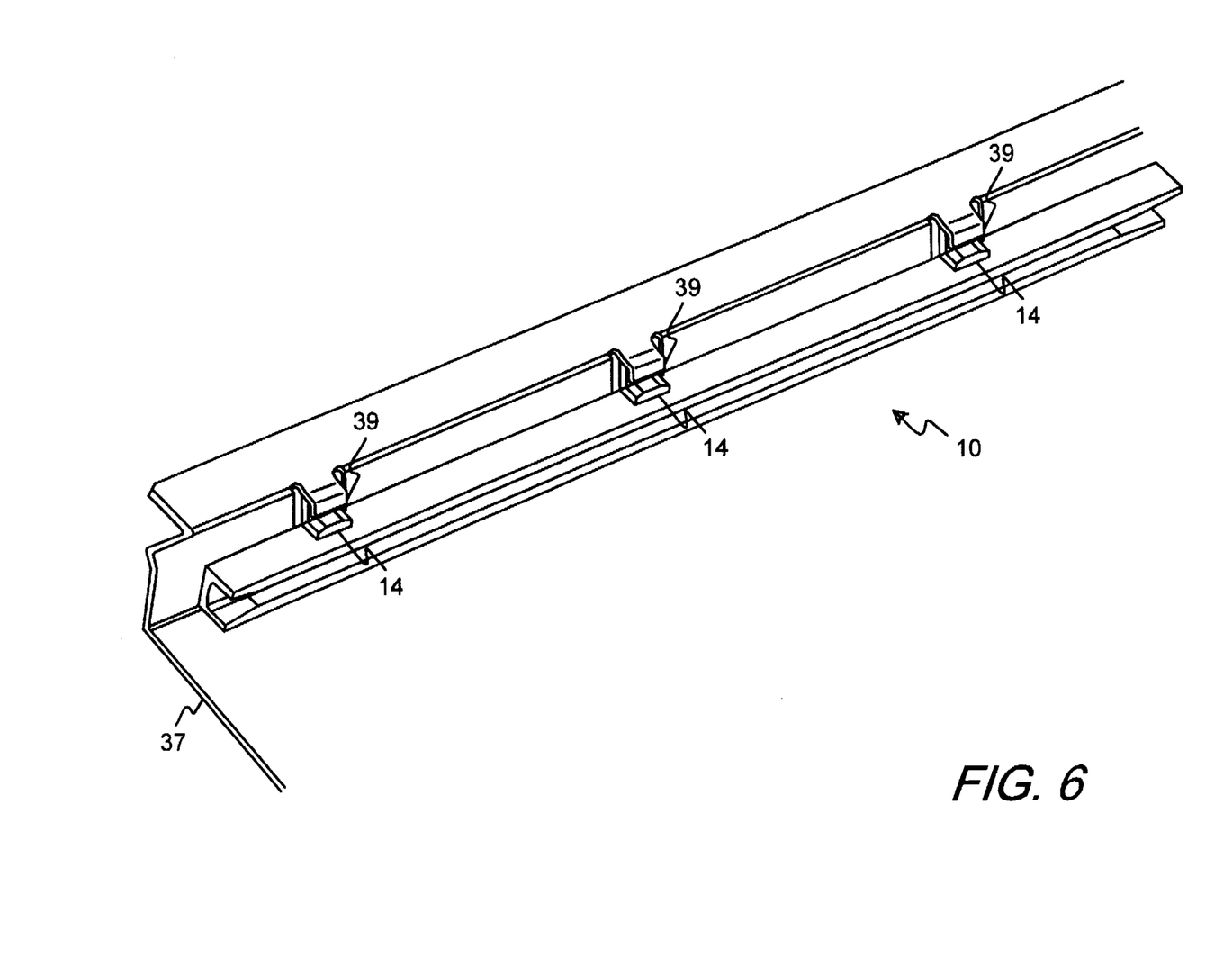
FIG. 6 shows a perspective view of a guide piece that has been mounted on a chassis with a corner offset.

Referring now to FIG. 6, guide piece 10 is shown attached to chassis 37 in a corner offset in a horizontal orientation. Raised tabs 14 are mated with fingers 39 formed in the corner offset. Middle nubs 22 and end hubs 24 are seated respectively in middle nub holes 28 and end nub holes 30 (not shown). Guide piece 10 is attached and removed in this corner offset position in the same manner as described above with respect to FIG. 5.

Figure 7:
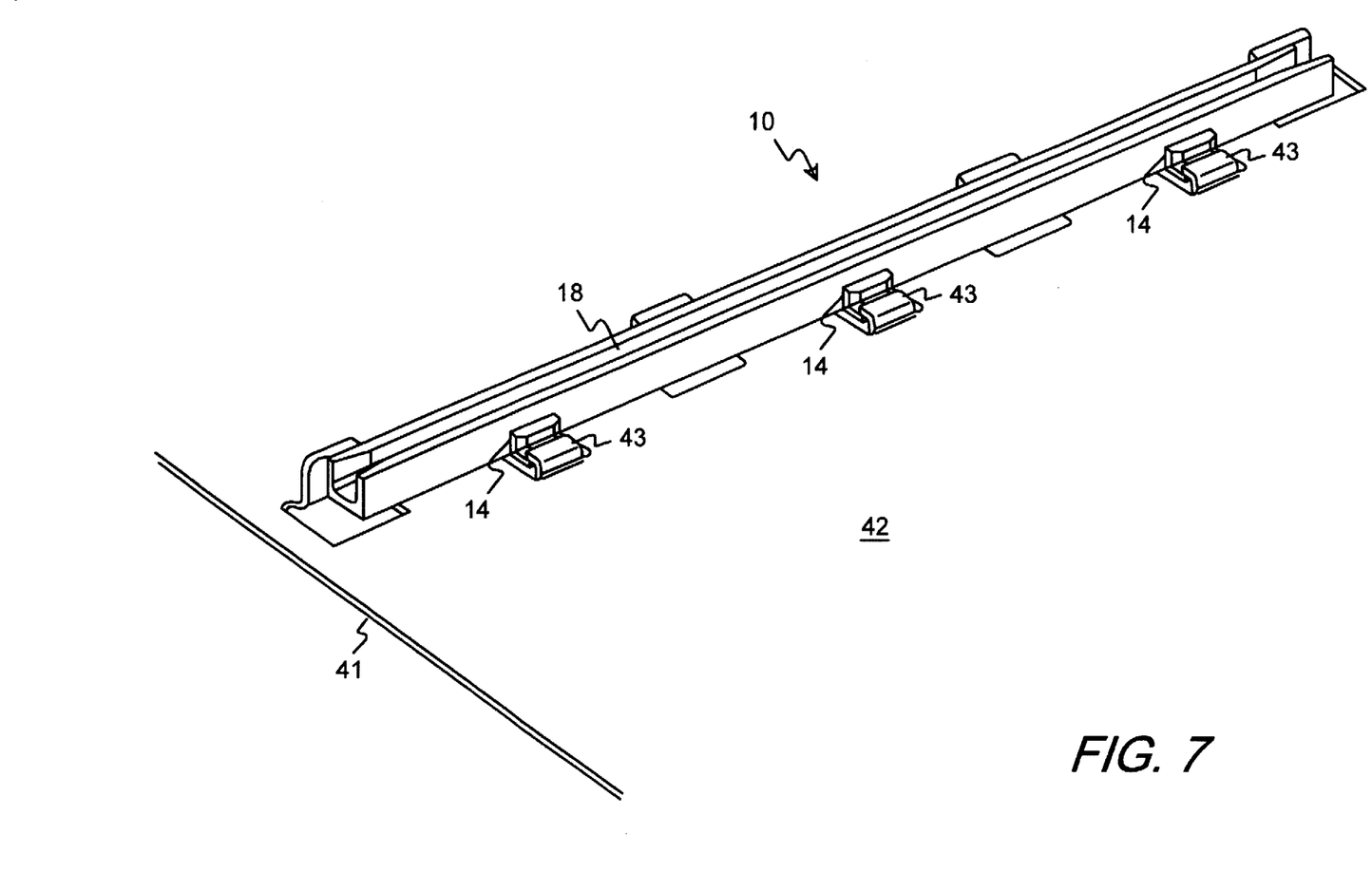
FIG. 7 shows a perspective view of a guide piece that has been mounted on a chassis in an interior location with a vertical orientation.

Referring now to FIG. 7, guide piece 10 is shown attached to chassis 41 in an interior location with a vertical orientation wherein U-shaped channel 18 faces up. Raised tabs 14 are mated with fingers 43 formed in bottom 42 of chassis 41.

Figure 8:
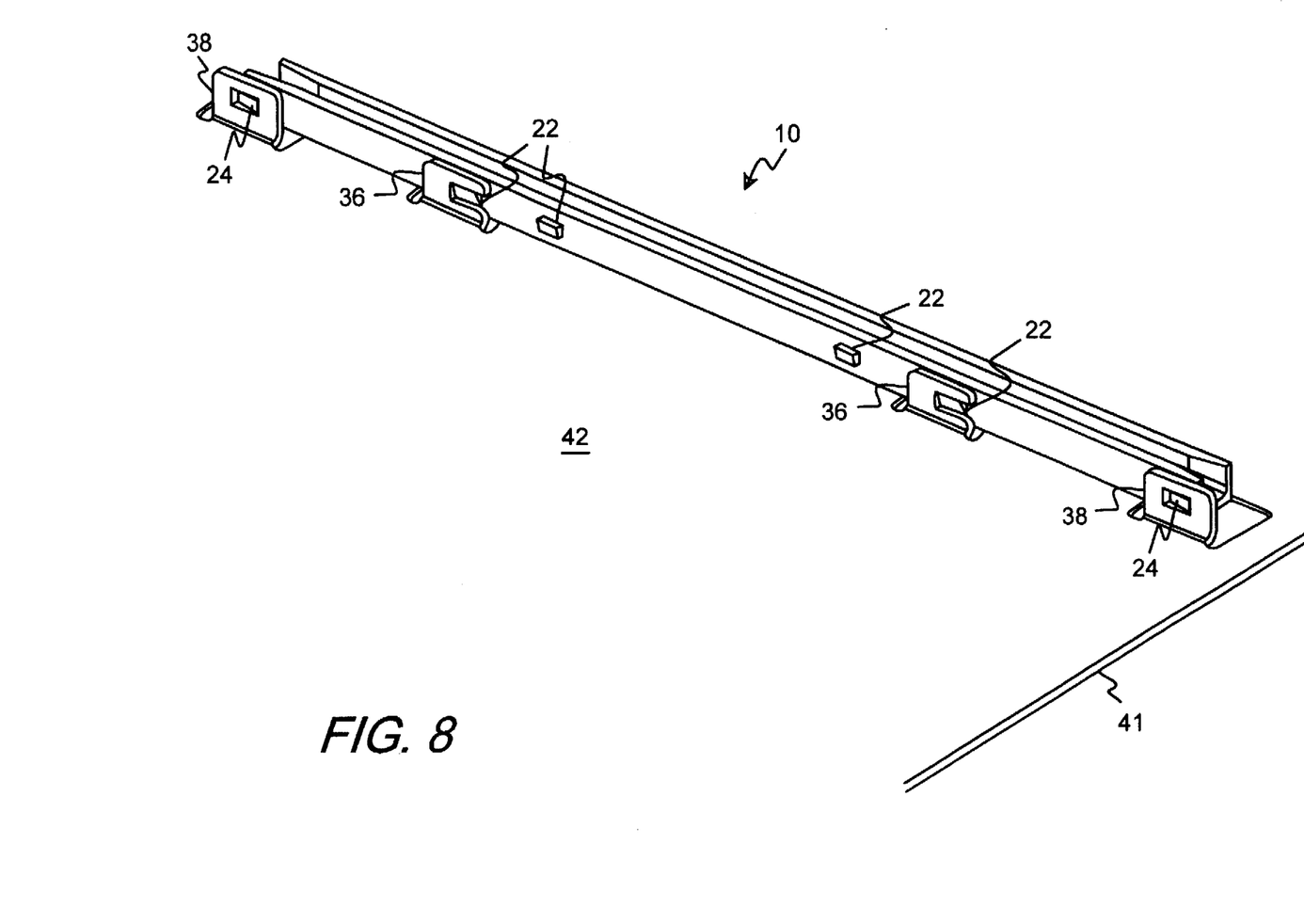
FIG. 8 shows a perspective view of the guide piece in FIG. 7 from the opposite side.

Referring now to FIG. 8, guide piece 10 as shown in FIG. 7 is shown in a perspective view from the opposite side. A plurality of C-brackets 36 are formed in bottom 42 of chassis 41 wherein each C-bracket will seat with a middle hub 22. O-shaped brackets 38 are formed in bottom 42 of chassis 41 wherein each O-shaped bracket will seat with an end nub 24. Guide piece 10 is attached and removed in this interior location with a vertical orientation in much the same manner as described above.

Figure 9:
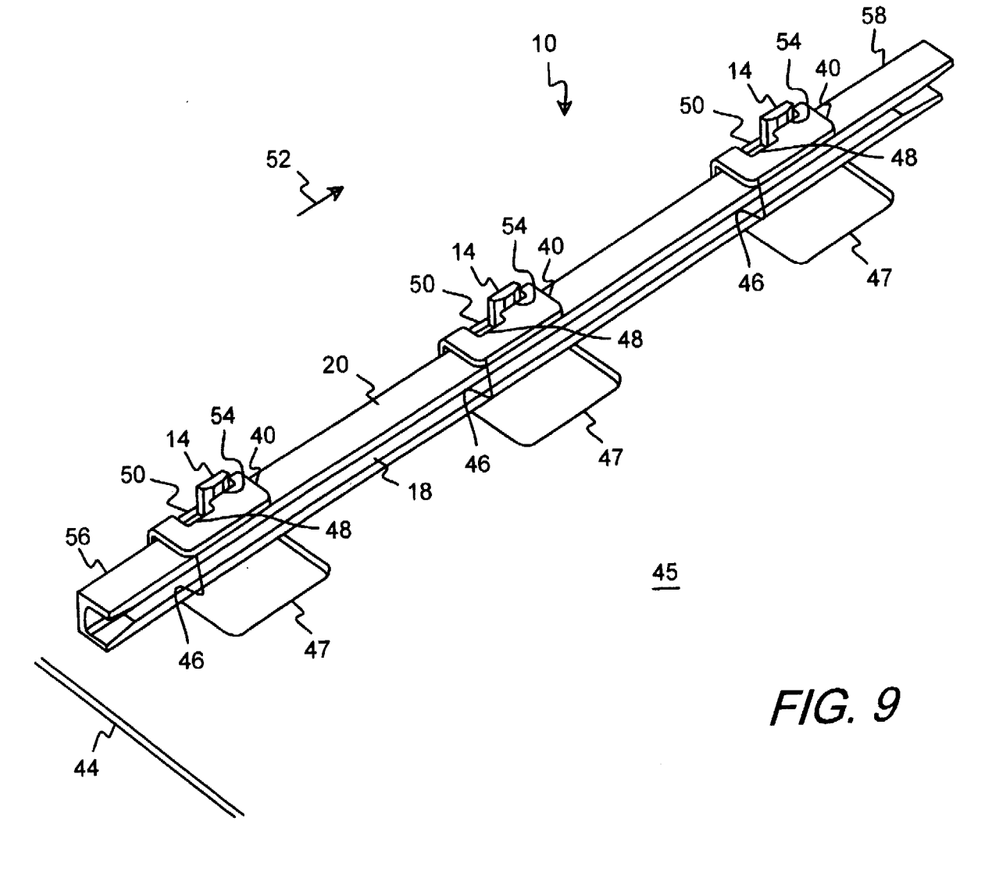
FIG. 9 shows a perspective view of the guide piece that has been mounted on a chassis in an interior location with a horizontal orientation.

Referring now to FIG. 9, guide piece 10 is attached to chassis 44 in an interior location with a horizontal orientation. Raised tabs 14 are mated with a plurality of slotted brackets 40 formed in bottom 45 of chassis 44 leaving cut outs 47. Middle nubs 22 and end nubs 24 are seated respectively in middle nub holes 28 and end nub holes 30 (not shown).

Attaching guide piece 10 in this interior location comprises positioning guide piece 10 in a slightly rotated orientation so that outer surface 26 faces generally toward, but is not parallel to bottom 45, outer surface 20 faces generally away from bottom 45, and U-shaped channel 18 faces generally horizontally away from slotted brackets 40. Guide piece 10 is positioned so that the tops of raised tabs 14 pass under the forward portions 46 of slotted brackets 40 and engage in the wider portions 48 of slots 50. Guide piece 10 is then rotated so that the extended legs of raised tabs 14 become vertical with respect to bottom 45 of chassis 44, and outer surface 26 becomes horizontal with respect to bottom 45 of chassis 44, resting upon end hubs 24 with middle nubs 22 positioned above middle hub holes 28 (not shown). Middle hubs 22 aid in this rotation process due to their beveled surfaces that contact with bottom 45 of chassis 44. Guide piece 10 is then moved laterally in the direction indicated by directional arrow 52. As the beveled portions of both legs of raised tabs 14 come in contact with the narrower portions 54 of slots 50 in slotted brackets 40, the middle portion of guide piece 10 is forced down, flexing guide piece 10 into a mild bow shape, and middle nubs 22 begin seating in middle hub holes 28 (not shown). End hubs 24 (not shown) are still resting on the upper surface of bottom 45 of chassis 44. As guide piece 10 is further moved laterally in the direction indicated by directional arrow 52, end nubs 24 seat in end hub holes 30 (not shown), snapping down into place due to the tension of the flexed guide piece 10. Snapping into place relieves the flexed bow shape of guide piece 10 and raised tabs 14 become fully mated with slotted brackets 40 and middle hubs 22 and end nubs 24 become fully seated respectively with middle hub holes 28 and end hub holes 30 (not shown).

To remove guide piece 10 from chassis 44 from the horizontal orientation shown in FIG. 9, front end 56 of guide piece 10 is lifted vertically to allow end nub 24 to clear end nub hole 30 (not shown). After being lifted, guide piece 10 is moved laterally in the opposite direction from directional arrow 52. As guide piece 10 is lifted and moved, trailing end 58 of guide piece 10 slides along the beveled surface of end nub 24 up and out of end nub hole 30 (not shown). When raised tabs 14 pass into wider portion 48 of slots 50 of slotted brackets 40, guide piece 10 is then rotated in the opposite direction from installation. As raised tabs 14 pass below and away from forward portions 46 of slotted brackets 40, guide piece 10 may then be fully removed from chassis 44.

The method of installation and removal as described above in reference to FIG. 9 may also be used in installation and removal in reference to FIG. 4 and FIG. 5, FIG. 6, and FIG. 7 and FIG. 8. However, this rotation method in reference to FIG. 9 is not as optimal as the methods previously described for these other orientations in FIG. 4 through FIG. 8.

Figure 10:
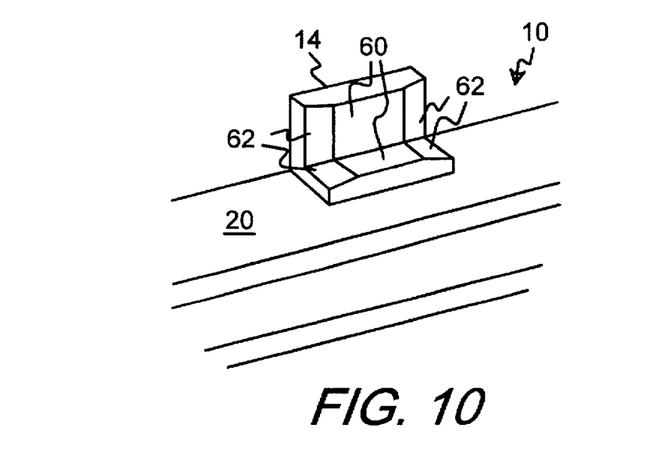
FIG. 10 shows a perspective view a raised tab.

Referring now to FIG. 10, a portion of guide piece 10 is shown wherein raised tab 14, located on outer surface 20, has two flat surfaces 60 on the interior side of each raised tab leg adjacent and perpendicular to each other. Extending out from each flat surface 60 are exterior beveled edges 62 which aid installation by allowing raised tabs 14 to slide along the beveled edges 62 against Fingers 32 (not shown in FIG. 10) to seat on flat surfaces 60.

Figure 11:
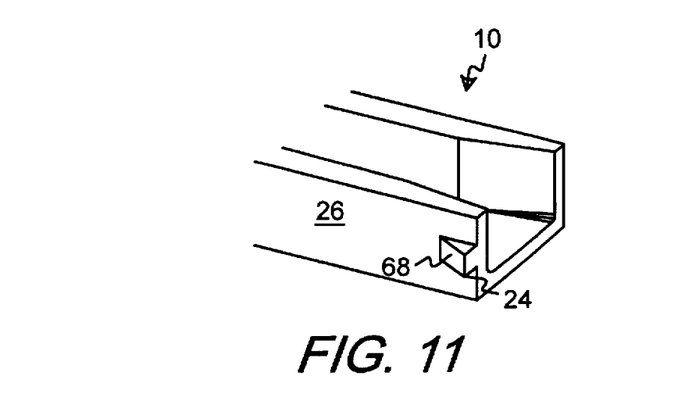
FIG. 11 shows a perspective view of an end nub.

Referring now to FIG. 11, a portion of guide piece 10 is shown wherein end nub 24, located on outer surface 26, has a beveled top surface 68 angled away from outer surface 26 in a same direction as a long dimension of guide piece 10. One skilled in the art will recognize that the orientation of end nub 24 may be reversed, requiring opposite lateral movements from those described above for installation and removal of guide piece 10 from a chassis.

Figure 12:
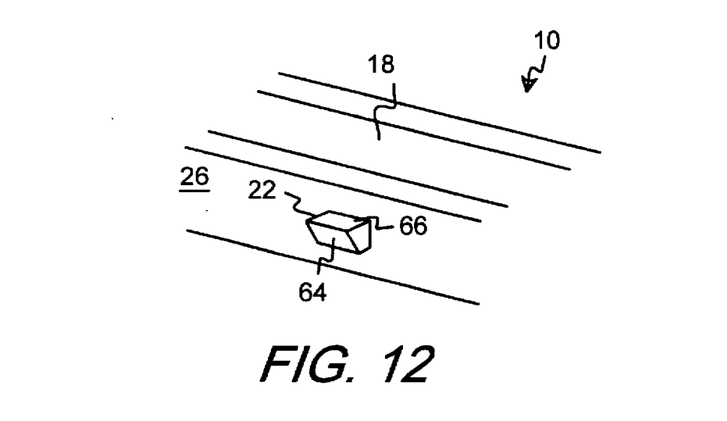
FIG. 12 shows a perspective view of a middle nub.

Referring now to FIG. 12, a portion of guide piece 10 is shown wherein middle nub 22, located on outer surface 26, has a beveled top surface 64 angled away from outer surface 26 forming a side of longest dimension 66 that is perpendicular to outer surface 26 and faces towards U-shaped channel 18.

Having described a presently preferred embodiment of the present invention, it will be understood by those skilled in the art that many changes in construction and widely differing embodiments and applications of the invention will suggest themselves without departing from the scope of the present invention, as defined in the claims. The disclosures and the description herein are intended to be illustrative and are not in any sense limiting of the invention, defined in scope by the following claims.

What is claimed is:

1. A guide piece for mounting in a chassis in multiple orientations, said guide piece comprising:

an elongated body;

a U-shaped channel extending along the entire length of said elongated body, said U-shaped channel having an end opening at each of two ends of said elongated body; and a first outer surface extending along a length of a first leg of said U-shaped channel, said first outer surface having a plurality of raised tabs affixed thereto wherein each of said raised tabs further comprises a first raised tab leg extending parallel to said first outer surface and perpendicular to a long dimension of said elongated body, and a second raised tab leg extending perpendicular to said first outer surface and perpendicular to said first raised tab leg, wherein said first and second raised tab legs join to form an L-shape, wherein said L-shape faces in a same direction as said U-shaped channel.

2. The guide piece as claimed in claim 1, further comprising:

a second outer surface extending along the entire length of a second leg of said U-shaped channel and having an end nub affixed to said second outer surface at one of said two ends of said elongated body.

3. The guide piece as claimed in claim 2, wherein said end nub further comprises:

a beveled top surface angled away from said second outer surface in a same direction as a long dimension of said elongated body.

4. The guide piece as claimed in claim 1, further comprising:

a second outer surface extending along the entire length of a second leg of said U-shaped channel, said second outer surface having a plurality of middle nubs affixed thereto between said two ends of said elongated body.

5. The guide piece as claimed in claim 4, wherein said plurality of middle nubs each further comprises:

a beveled top surface angled away from said second outer surface in a direction perpendicular to a long dimension of said elongated body wherein the angle of said beveled top surface forms a side of longest dimension, said side of longest dimension being perpendicular to said second outer surface and facing towards said U-shaped channel.

6. The guide piece as claimed in claim 1, wherein each of said raised tabs further comprises:

a first flat surface extending along an interior face of said first raised tab leg and a second flat surface extending along an interior face of said second raised tab leg, said first and second flat surfaces having exterior beveled edges along each side of said first and second raised tab legs, said exterior beveled edges angling toward said first outer surface.

7. A guide piece for mounting in a chassis in multiple orientations, said guide piece comprising:

an elongated body;

a U-shaped channel extending along the entire length of said elongated body, said U-shaped channel having an end opening at each of two ends of said elongated body;

a first outer surface extending along a length of a first leg of said U-shaped channel, said first outer surface having a plurality of raised tabs affixed thereto wherein each of said raised tabs further comprise a first raised tab leg extending parallel to said first outer surface and perpendicular to a long dimension of said elongated body, and a second raised tab leg extending perpendicular to said first outer surface and perpendicular to said first raised tab leg, wherein said first and second raised tab legs join to form an L-shape, wherein said L-shape faces in a same direction as said U-shaped channel; and a second outer surface extending along the entire length of a second leg of said U-shaped channel and having an end nub affixed to said second outer surface at one of said two ends of said elongated body.

8. The guide piece as claimed in claim 7, further comprising:

a plurality of middle nubs affixed to said second outer surface between said two ends of said elongated body.

9. The guide piece as claimed in claim 8, wherein said plurality of middle nubs each further comprises:

a beveled top surface angled away from said second outer surface in a direction perpendicular to a long dimension of said elongated body wherein the angle of said beveled top surface forms a side of longest dimension, said side of longest dimension being perpendicular to said second outer surface and facing towards said U-shaped channel.

10. The guide piece as claimed in claim 7, wherein each of said raised tabs further comprises:

a first flat surface extending along an interior face of said first raised tab leg and a second flat surface extending along an interior face of said second raised tab leg, said first and second flat surfaces having exterior beveled edges along each side of said first and second raised tab legs, said exterior beveled edges angling toward said first outer surface.

11. The guide piece as claimed in claim 7, wherein said end hub further comprises:

a beveled top surface angled away from said second outer surface in a same direction as a long dimension of said elongated body.

* * * * *

UNITED STATES PATENT AND TRADEMARK OFFICE
CERTIFICATE OF CORRECTION

PATENT NO. : 5,738,226
DATED : April 14, 1998
INVENTOR(S) : Ronald P. Dean

It is certified that error appears in the above-identified patent and that said Letters Patent is hereby corrected as shown below:

<u>Title page, Response filed 10/8/97</u>: delete "AND METHOD" (PTO'S error)

<u>Claims:</u>
<u>Column 8,</u>
Line 21: "comprise" should be -- comprises -- (PTO's error)
Line 59: "hub" should be -- nub -- (PTO's error)

Signed and Sealed this

Eighteenth Day of September, 2001

*Attest:*

NICHOLAS P. GODICI
*Attesting Officer*    Acting Director of the United States Patent and Trademark Office